United States Patent [19]

Soleimani et al.

[11] Patent Number: 5,659,892
[45] Date of Patent: Aug. 19, 1997

[54] OPERATION OF LOW-COST, FIXED OUTPUT POWER RADIO IN FIXED GAIN MODE

[75] Inventors: Mohammad Soleimani, Rockville; D. Ray Lowe, Gaithersburg; Guy Montgomery, Wheaton; Henry Eck, Germantown; Eryx Malcolm, Bethesda; Royce Hernandez, Germantown; Tom Jackson, Frederick; Jack Lundstedt, Monrovia, all of Md.

[73] Assignee: Hughes Electronics, Los Angeles, Calif.

[21] Appl. No.: 502,029

[22] Filed: Jul. 13, 1995

[51] Int. Cl.$^6$ .................................................. H04B 1/04
[52] U.S. Cl. ........................... 455/103; 455/126; 455/127
[58] Field of Search ............................... 455/103, 126, 455/127, 115, 116

[56] References Cited

U.S. PATENT DOCUMENTS 5,526,529  6/1996  Tamano .................................. 455/103
5,530,920  6/1996  Takeda ................................ 455/103 X
5,574,980  11/1996  Nomura .............................. 455/103 X

*Primary Examiner*—Chi H. Pham
*Attorney, Agent, or Firm*—John T. Whelan; Wanda Denson-Low

[57] ABSTRACT

A method and system for using a low-cost, fixed output power radio in a multi-carrier communication system is disclosed herein. This system measures the output power of the multiple channel units within the system, obtains the current output power of the system, calculates a composite power and an expected power, compares the expected power and the current output power to calculate a gain adjustment value, and adjusting the output power of the system via the amplifier. The method for adjusting the power can also allow at least one of the carriers in the multi-carrier system to operate in a burst mode, and at least one of the remaining carriers to operate in a continuous mode during power measurement and gain adjustment steps.

19 Claims, 2 Drawing Sheets

OPERATION OF LOW-COST, FIXED OUTPUT POWER RADIO IN FIXED GAIN MODE

BACKGROUND OF THE INVENTION

The present invention relates to satellite multi-carrier burst communication systems and methods, and, more particularly, to such systems and methods in which a low-cost, fixed output power radio is operated with fixed gain to provide improved system performance.

Generally, in satellite communication systems, earth transmission stations modulate a video, audio or data signal and transmit the signal to an orbiting satellite. The satellite then relays the information to a receiving antenna in a different location. Each earth transmission station in the system typically uses one or more channel unit modules which output a 70 Mhz intermediate frequency output. This hardware module connects to a user voice or data interface, and performs voice end coding/decoding, channel coding/decoding, and modulation/demodulation functions.

The earth transmission station utilizes an outdoor unit, which operates as an amplifier to amplify the L-band channel unit output and converts it to C/Ku/other band before it is fed to a transmission antenna.

In single-carrier satellite communication systems, the outdoor unit operates at a fixed power level and incorporates a method of power control unique to the unit. In a multi-carrier communication system, up to four channel units are linked together in a chassis to allow up to four calls to be in progress at any one time. Previously, applications that required fixed gain operation used an outdoor unit radio specifically designed for fixed gain operation in a multi-carrier environment. Such a radio is expensive relative to a fixed output radio for a single carrier environment. However, the cost of the outdoor unit is prohibitively expensive for many conventional satellite communication systems. Furthermore, the currently available multi-carrier outdoor unit does not guarantee a constant gain in relation to temperature and other site-to-site environmental factors. The unit also does not compensate for variations in the gain characteristics of the cables and other equipment used for connecting indoor equipment with outside equipment during operation of the system. Such changes occur due to temperature, humidity and other environmental factors. Furthermore, the initial installation of such systems is complicated because various site-to-site differences are inherent in the gain due to the use of different cable lengths, connectors, and other hardware items that also vary from site-to-site.

In order to reduce expense, a multi-carrier system can utilize the traditional, low-cost, single carrier outdoor unit. The single carrier outdoor unit has the advantage of guaranteeing a constant gain in relation to temperature, unlike its more expensive counterpart. The low-cost outdoor unit, however, does not allow each individual channel unit the ability to transmit over the satellite at different power levels. The low-cost outdoor unit can regulate its own output power, but cannot compensate for the various power levels of the channel units during transmissions. Consequently, a new method of power control is needed to use such an outdoor unit with a multi-carrier system.

Therefore, there is a need for a method for using a low-cost, fixed output power radio in a multi-carrier burst-mode communication application which allows the radio to operate with fixed gain, thereby preserving the amplitude relationships among the various signals output by system.

Furthermore, there is a need for a method of monitoring and controlling the gain of an outdoor unit used in a multi-carrier satellite communication system.

SUMMARY OF THE INVENTION

The present invention is accordingly directed to a satellite multi-carrier communication system that utilizes a low-cost fixed-gain power radio. The method preserves the amplitude relationships among the signals to be transmitted, and uses hardware and software to provide a method of monitoring and controlling the radio gain for a multi-carrier system.

In one aspect of the present invention, a method for adjusting the output power of a multi-carrier communication system is provided comprising measuring the output power of each of the channel units in the system, obtaining the current output power of the system, calculating a composite power from the output power of the channel units, calculating an expected power at the output of the system based on the composite power, comparing the system power with the expected power, calculating a gain adjustment value based on this comparison, and adjusting the output power of this system based on the gain adjustment value.

In another aspect of the present invention, a method is provided wherein at least one of the carriers in the multi-carrier system can operate in a burst mode, and power calculations are performed on the system based on the burst timing of the carrier.

In yet another aspect of the present invention, a multi-carrier communication system is provided comprising an interface for converting user voice or data into an intermediate frequency signal; a plurality of interconnected channel units, with at least one of the channel units being selectable as a power control channel unit; a radio power amplifier designed to operate at fixed-output power; and a radio frequency module connected to the channel units, the radio power amplifier, and the interface. The radio frequency module obtains measurements of system parameters to be used in calculating values for gain adjustment in the radio power amplifier. In particular, the radio frequency module reads the output power, gain, and expected power of the radio power amplifier, and collects other data which is indicative of the intermediate frequency signal.

These and other features and advantages of the invention will become apparent upon the review of the following detailed description of the presently preferred embodiments of the invention, taken into conjunction with the appended figures.

DESCRIPTION OF THE DRAWINGS

The invention will be explained with reference to the drawings, in which.

DETAILED DESCRIPTION OF THE PRESENTLY PREFERRED EMBODIMENT

Figure 1:
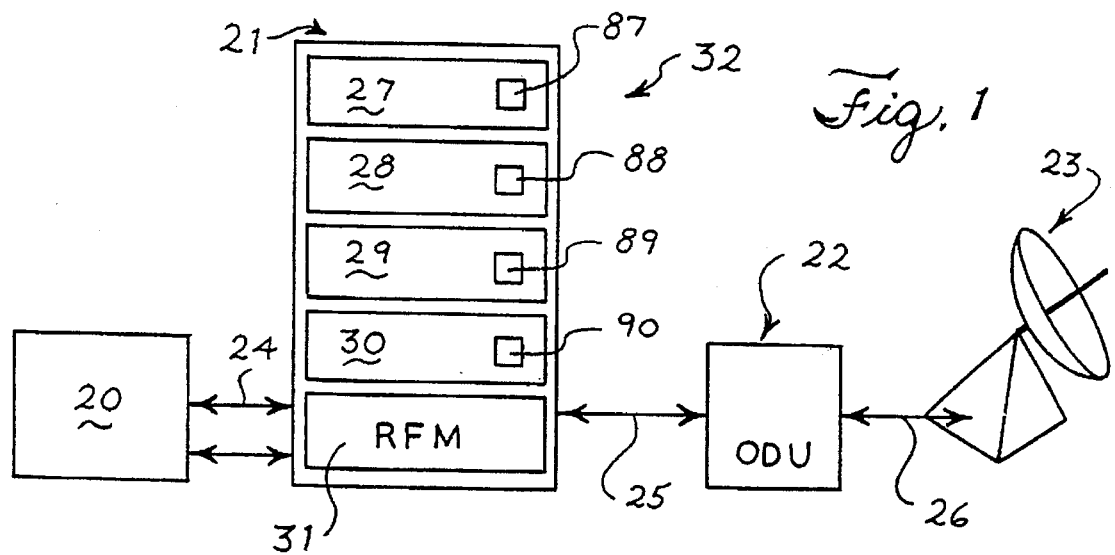
FIG. 1 is a high-level block diagram of a remote-site earth transmission station implementing the present invention.

A block diagram of the system used in the preferred embodiment of the invention is shown in FIG. 1. The figure illustrates a typical multi-carrier, remote site configuration, which includes an intermediate frequency module 20, a plurality of channel units 27, 28, 29 and 30 linked with a radio frequency module 31 within a chassis 21. The configuration also provides an outdoor unit 22 ("ODU") and a transmission antenna 23. The intermediate frequency module 20 provides an interface between the baseband output of the user interface port card, and receives user data, such as video and/or audio. The intermediate frequency module 20 is connected to an interface on the radio frequency module 31 via serial link 24. The radio frequency module 31 provides an interface between the ODU 22 and the chassis channel units 27, 28, 29 and 30 and the intermediate frequency module 20.

The ODU 22 is preferably a low-cost radio power amplifier, which is operable in a fixed-output power mode when used in a single-carrier communication system. The ODU 22 is interfaced with the radio frequency module 31. The chassis 21 and intermediate frequency module 20 are usually located indoors, free from most environmental variables. The amplified radio frequency signal 26 output by the ODU 22 is transmitted by antenna 23 to an orbiting satellite.

The preferred embodiment of the invention comprises an Effective Isotropic Radiated Power ("EIRP") algorithm present in system 32 to provide a means of monitoring and controlling the output power of the ODU 22 while a channel unit is servicing a call. The measurement process is controlled by the power control channel unit, which may be any of the channel units 27, 28, 29 and 30. The power control channel unit 30 is dynamically selected by the radio frequency module 31, and only one of the channel units 27, 28, 29 and 30 at a given site can be designated the power control channel unit at any given time. For purposes of this description, channel unit 30 is designated as power control channel unit 30. A channel unit 27, 28, 29 and 30 that has been selected as a power control channel unit does not lose any other normal capabilities, it only assumes the additional responsibility of monitoring and controlling the power output of the system 32.

The software that runs the power control algorithm is common to all of the channel units 27, 28, 29, and 30. However, because only one of the channel units will be selected as the power control channel unit (in this example, 30) per site, the power control channel unit code will be executed on only one channel unit at any given time. Thus, the power control channel unit may be viewed as a channel unit that is currently executing the power control algorithm tasks, and not as a different type of channel unit.

The power control channel unit 30 collects data to be used in power control calculations and adjustments. At periodic intervals, the power control channel unit 30 will initiate a power control cycle. The process begins with the power control channel unit 30 determining the current operational state of each channel unit 27, 28, 29 and 30. The channel units 27, 28, 29 and 30 can each be in an active or inactive state. This step is necessary because only data from active channel units can be used in the power measurements and calculations. If none of the channel units 27, 28, 29 and 30 are currently involved in a call, the power control channel unit 30 will randomly select one of the channel units 27, 28, 29 and 30 to initiate a dummy call on a "keep alive" channel. At least one channel unit must therefore be operational in a continuous state in order for power measurements to be taken.

Once at least one channel unit in the chassis 21 is confirmed to be in an active and continuous state, the power control channel unit 30 commands each channel unit 27, 28, 29 and 30 to set its respective voice activation (VOX) off. If a channel unit is not presently serving a call, the command from the power control channel unit 30 will have no effect. However, if the channel unit is presently serving a call, the command will cause the channel unit to transmit continuously, in a non-burst format. This step is preferred because voice calls are "bursty" in nature, and such non-continuous operation may corrupt the accuracy of the power measurements.

Alternatively, the system can allow at least one of the channel units to remain in burst mode. The non-bursting, continuous channel units would then be used for the measurement. The bursting channel unit may also be used for measurement purposes by measuring the duty cycle times of the bursting carrier or carriers and multiplying these values times the calibrated power at the bursting channel unit. This value then becomes the actual value of the individual channel unit power used in the summation of the power from all of the channel units.

With each call-servicing channel unit for measurement transmitting continuously, the radio frequency module 31 collects the current ODU output power, current ODU gain, and commissioned ODU gain. The radio frequency module 31 will also read the transition detectors 87, 88, 89 and 90 which are present on the channel unit chassis 21. The transition detectors can detect if one of the channel units 27, 28, 29 and 30 has initiated or terminated a call while the measurement is in progress.

Finally, the radio frequency module 31 collects the transmission power, FEC rate, information rate, and the modulation format of each channel unit signal. Once all of the relevant data measurements are taken, the radio frequency module 31 commands each of the channel units 27, 28, 29 and 30 to resume its previous VOX state. If necessary, the power control channel unit 30 will command the proper channel units to terminate any dummy calls that are in progress on a keep alive channel.

The radio frequency module 31 then passes all the collected data to the power control channel unit 30. The power control channel unit 30 checks each of the four transition detectors 87, 88, 89 and 90 on chassis 21 to determine whether a transition has occurred in any of the channel units 27, 28, 29 or 30 during the measurement. If so, the current measurement will be considered invalid, and the entire measurement process will be repeated. Otherwise, the power control channel unit 30 uses the information to calculate the actual transmit level. It will then compare the actual transmit level against the expected ODU 22 transmit level and adjust the gain of the ODU accordingly. This feedback algorithm is illustrated in the block diagram of FIG. 2.

Figure 2:
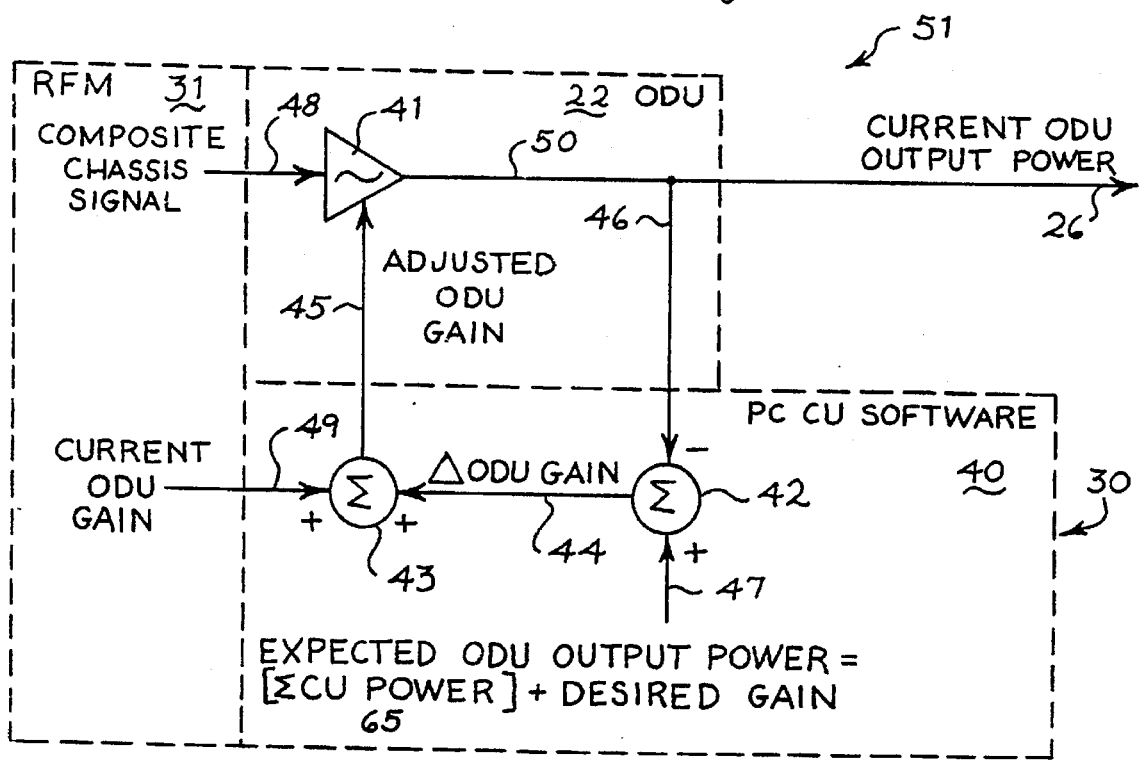
FIG. 2 is a high-level block diagram showing the feedback loop used in the present invention.

FIG. 2 shows radio frequency module 31 connected to ODU 22 and power control channel unit 30. The ODU 22 has a power amplifier 41 having output 50 and gain input 45. The power control channel unit 30 contains software that provides logarithmic summations at 42 and 43. The power control channel unit 30 is connected to the radio frequency module 31 via input 49.

As also shown in FIG. 2, the composite chassis signal 48 from the radio frequency module 31 is fed into amplifier 41 of ODU 22. The current ODU output power 50 is fed via RF line 26 to the outdoor antenna 23. The gain of amplifier 41 of ODU 22 is adjusted via input 45.

As shown in FIG. 2, the software 40 within power control channel unit 30 calculates the adjustment to be made to the amplifier 41. The software 40 receives the actual ODU output power 46, and subtracts this value from the expected ODU output power 47. The expected ODU output power 47 is calculated by adding the commissioned gain to the composite power 65. The composite power 65 is the summation of the power from each of the channel units 27, 28, 29, and 30, and the commissioned gain is a value sent by the system operators through the intermediate frequency module 20 to chassis 21. Alternatively, the commissioned gain may be a stored value within the programmable or permanent memory of the radio frequency module 31. Through these operations, the power control channel unit software 40 compares the expected ODU output power 47 with the actual ODU output power 46. The difference is a "ΔODU Gain" value 44.

To determine the adjustments to be made to the ODU gain (gain setting), the current ODU gain setting 49 is added to the ΔODU Gain value 44. The resulting new ODU gain setting is input via 45 to change the gain of amplifier 41. Each new gain setting will be stored in a memory log to be used for system debugging or other use by the system.

The above values are preferably retained in the system as logarithmic unit values. Therefore, the adding and subtracting operations are performed to compute subsequent values and system adjustments. In systems where logarithmic values are not used, operations would alternatively be performed via multiplication and division.

Other power control algorithms may be utilized in the system of the preferred embodiment for it to collect power control data. One example of an alternative algorithm is the "satellite power control method." The EIRP power control method is preferred in the disclosed embodiment because the satellite power control function cannot take power measurements while all channel units are servicing calls.

Preferably, the EIRP power measurements will be taken at periodic intervals. Initially, the interval is indicated by a network-loaded system parameter. Once the power control mechanism is operational, however, the power control channel unit can use an algorithm to continuously monitor the rate at which the ODU gain is modified. The EIRP power measurement rate is preferably set to 10 minutes, with a maximum of 15 minutes and a minimum of 1 minute.

An adaptive algorithm is preferred to a constant time interval for the measurements because the effective ODU output power is dependent on changes in temperature. Thus, the output power may require more frequent monitoring at some remote sites than others. Furthermore, because the EIRP power control method maintains the VOX off for a significant amount of time, the reliability and availability of the channel units will decrease as the amount of measurements increase. A balance should preferably be maintained.

The EIRP power control algorithm of the present invention will preferably not operate during the initial or boot stages of system operation. The commissioned gain value that is stored in the permanent memory of the radio frequency module 31 will be utilized as the default ODU gain setting upon startup. Alternatively, the ODU can operate at constant power prior to any channel unit being operational on the condition that only one channel unit will be transmitting at a time during the burst stage. When the first channel unit becomes operational, the ODU is queried for its operating gain point, and the power control channel unit will use that gain setting as the initial setting for the power control process.

Figure 3:
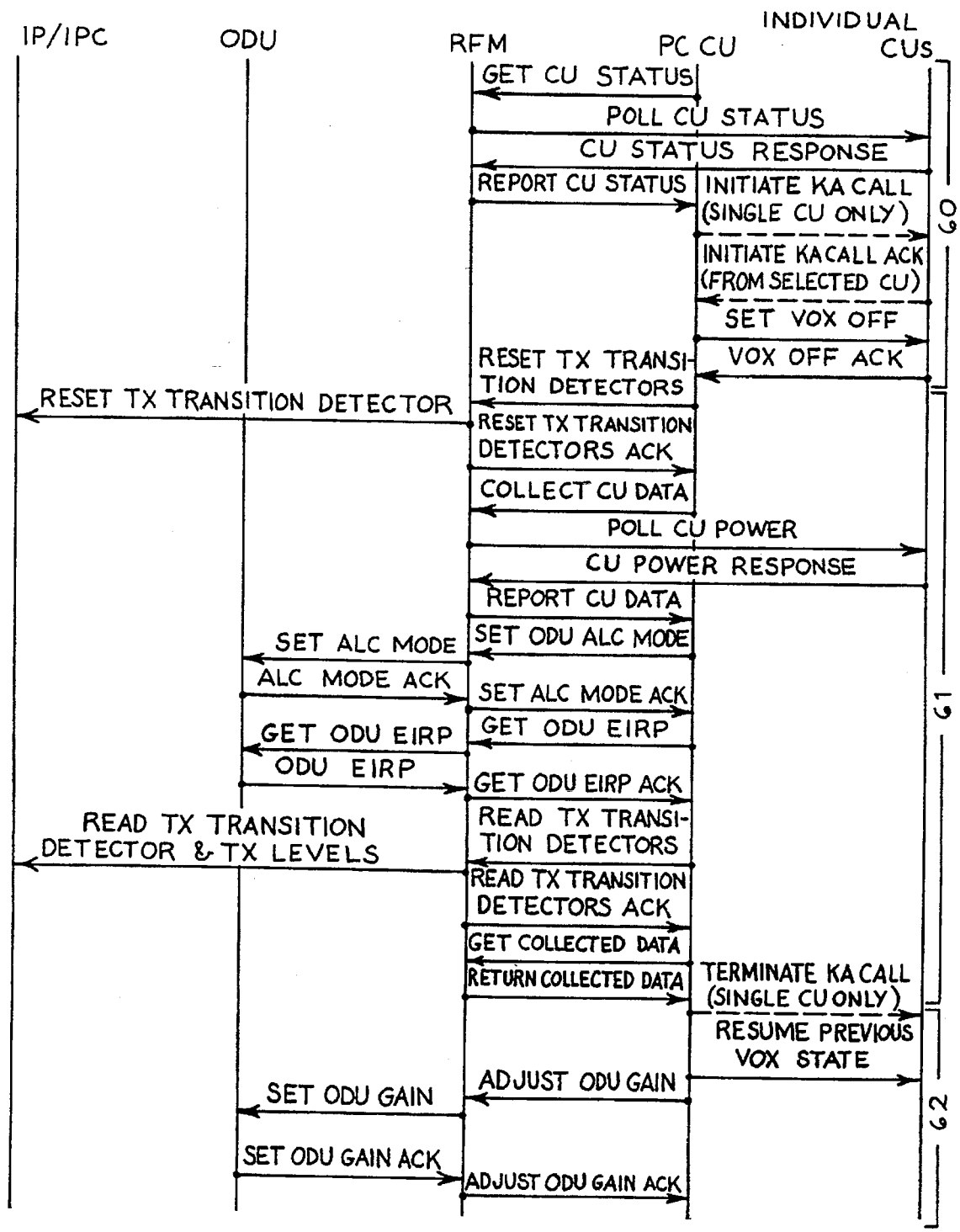
FIG. 3 is a sequential timing diagram showing the power control steps utilized in the present invention.

A more detailed diagram of the power control measurement and adjustment steps of the preferred embodiment of the invention is shown in FIG. 3. The diagram shows the flow of power control messages among the intermediate frequency module 20; ODU 22; radio frequency module 31; power control channel unit 30; and the individual channel units 27, 28, 29, and 30 of FIGS. 1 and 2. The power control steps may be subdivided into three main phases as shown in the figure: a measurement preparation phase 60, a data measurement phase 61, and a gain adjustment phase 62.

The measurement preparation phase 60 involves the steps of querying the status of each channel unit, initiating a keep alive call, and commanding the channel units to turn the VOX off. Referring to both FIGS. 1 and 3, during the first step, the power control channel unit 30 will command the radio frequency module 31 to collect data from all active (or operational) channel units 27, 28, 29, and 30. The radio frequency module 31 will then utilize a conventional poll-response mechanism to determine the status of each of the channel units 27, 28, 29, and 30 to be either active or inactive. The radio frequency module 31 will then return the status of each channel unit back to the power control channel unit 30. The power control channel unit 30 will not continue the process until it has received the proper response from the radio frequency module 31.

If no acknowledgement is received from the radio frequency module 31, the power control channel unit 30 will assume that a failure has occurred. The radio frequency module 31 will be considered inoperable and the particular EIRP measurement will be skipped. The system will then continue to retry EIRP measurements until it is successful.

With the power control channel unit 30 in possession of the status of each channel unit, it can determine which channel units 27, 28, 29, and 30 are active and which channel units are currently servicing calls. If no channel unit is involved in a call at the time of a measurement, the power control channel unit 30 will randomly select one of the active channel units 27, 28, 29 or 30 to initiate a call on its keep alive frequency. The channel unit will also initiate a timer, which will serve as a time-out in case the channel unit does not receive the corresponding command from the power control channel unit 30 to terminate the keep alive call. The power control channel unit 30 will not continue the EIRP measurement until an acknowledgment is received from the selected channel unit.

If no acknowledgment is received, the power control channel unit will assume that the present channel unit has failed. The power control channel unit 30 will then randomly select another channel unit 27, 28, 29 or 30 and repeat the above process. If all active channel units fail this step, the power control channel units will restart the entire measurement process until a valid measurement can be taken.

Finally, the power control channel unit 30 will be responsible for sending a "VOX OFF" command to each channel unit to turn off the voice activation features on each of the channel units 27, 28, 29 and 30. Each channel unit will also initiate its own timer, which will serve as a time-out in case the respective channel unit does not receive a corresponding "Resume VOX State" command back from the power control channel unit 30. The system will await an acknowledgment from the channel unit to continue. If any error conditions are detected by the power control channel unit 30 involving acknowledgments from the individual channel units 27, 28, 29 and 30, the power control channel unit 30 will stop the current measurement, send a Resume VOX State command, reset any internal state machines and continue to retry measurements until it is successful.

The data measurement phase 61 involves the steps of resetting the transition detectors 87, 88, 89 and 90, collecting channel unit data from each channel unit 27, 28, 29 and 30, setting the ALC mode in the ODU 22, retrieving the current ODU power, and reading the transition detectors 87, 88, 89 and 90. In the first step, the power control channel unit 30 will command the radio frequency module 31 to reset the transition detectors 87, 88, 89 and 90 present on the radio frequency module 31. This will enable the radio frequency module 31 to detect any channel unit transitions while the VOX is turned off. The power control channel unit 30 will await a "Reset Tx Detectors" acknowledgement from the radio frequency module 31 before continuing. If no acknowledgement is received, the power control channel unit 31 will assume a failure has occurred. The radio frequency module 31 will be considered inoperable and the particular measurement will be skipped, and the system will continue to retry the EIRP measurements until it is successful.

In the second step, the power control channel unit 30 will command the radio frequency module 31 to collect channel unit status information from each channel unit 27, 28, 29 and 30, including the power control channel unit 30. The radio frequency module 31 will utilize its conventional poll-response mechanism to obtain the data from each channel unit. The transmission power, FEC rate, information rate, and modulation rate for each channel unit 27, 28, 29 and 30, will be recorded and passed back to the power control channel unit 30 in a response. Again, if no acknowledgement is received, the power control channel unit will assume a failure has occurred, and attempt corrective measures as in the previous step.

In the next step, the power control channel unit 30 will command the radio frequency module 31 to set the ALC mode of the ODU 22. The radio frequency module is responsible for determining the proper mode. The radio frequency module 31 will then send a response to the power control channel unit 30 indicating that the ALC mode has been set, at which point the power control channel unit 30 will continue normal power control operation. Again, if no acknowledgement is received, the power control channel unit 30 will assume a failure has occurred and take corrective measures.

The power control channel unit 30 will next command the radio frequency module 31 to command the ODU 22 to obtain the current ODU output power. The radio frequency module 31 will await a response from the ODU 22, and then pass the current output power value back to the power control channel unit 30. The power control channel unit 30 will not continue until the response has been received. If no acknowledgement is received, the power control channel unit 30 will assume a failure has occurred and take corrective measures.

The power control channel unit 30 will next command the radio frequency module 31 to read the four transition detectors 87, 88, 89 and 90. The radio frequency module 31 will respond with the state of the four transition detectors, and thus the states of the four respective channel units 27, 28, 29 and 30. The power control channel unit 30 will not continue until the acknowledgement is received. If no acknowledgement is received, the power control channel unit 30 will assume a failure has occurred and take corrective measures.

At this point, all the necessary data for the measurement has been collected, so the power control channel unit 30 will command the radio frequency module 31 to send the commissioned ODU gain (present within programmed memory) and current ODU gain to the power control channel unit 30. The power control channel unit 30 will expect an acknowledgement for each command and will not process the next command until such acknowledgement is received.

Finally, the gain adjustment phase 62, which comprises the steps of terminating any keep alive calls, commanding the channel units to resume their previous VOX state, processing EIRP data, and adjusting the ODU gain, is begun. After the power control channel unit 30 collects the necessary data, the power control channel unit will command any of the channel units 27, 28, 29 or 30 to terminate any keep alive call which was initiated before the measurement steps. A channel unit in a keep alive call will simply stop transmitting and clear the timer used for the keep alive call. The power control channel unit 30 will then notify each channel unit 27, 28, 29 and 30 to resume the previous VOX state before measurement took place. No acknowledgement is expected for either of these steps.

In the next step, with all the necessary data, the power control channel unit will determine the new setting for the ODU 22. First, the power control channel unit will check the retrieved data from the transition detectors 87, 88, 89 and 90 to see if any transitions occurred during the measurements, and if so, consider the measurement invalid and restart another measurement cycle immediately. Otherwise, the system will calculate the composite channel unit output power and perform the calculations as described above.

Regardless of whether the new ODU gain has changed, the power control channel unit 31 will send the new gain to the radio frequency module 31. The radio frequency module 31 will then record the new ODU gain and measurement interval and relay the command to the ODU 22. The power control channel unit 30 will terminate the measurement process when the acknowledgement is received back from the radio frequency module 31. If the power control channel unit 30 receives an acknowledgement, the measurement is considered complete, and the power control channel unit 30 will wait until the next prescribed interval for the next measurement. If no acknowledgment is received, the power control channel unit 30 will restart the entire process, and continue to retry measurements until it is successful.

Thus, a standard, fixed-output power radio can be used to provide multi-carrier operation. Other advantages of the present invention include the fact that the disclosed system compensates automatically for changes in the gain characteristics of cables and other equipment used for connecting indoor equipment with outdoor equipment while the system is operational, and also simplifies initial system installation by removing the need to initially adjust the system for site-to-site differences in gain due to the use of different cable lengths, cable types, and various other interface hardware.

Also, the invention allows the fixed gain operation during burst operation of one or more carriers. The fixed gain operation is supported in both of the following cases:

Case 1. Long-Time Constant Power Detection in the ODU

In this case the software present in the indoor unit measures the duty cycle of the bursting carrier or carriers and multiples the duty cycle times of the bursting carrier calibrated power at the source of the bursting carrier (CU power at the channel unit) which becomes the actual value of the CU power used in the summation.

Case 2. Short-Time Constant Power Detection in the ODU

In this case the power measurement at the ODU is correlated in time to the actual transmissions of the bursting carrier or carriers. The bursting carrier or carriers' power is included or not included in the summation of the CU power depending on whether the carrier is on or off.

Of course, it should be understood that a wide range of changes and modifications can be made to the embodiments described above. For example, an increased number of channel units may be incorporated into the chassis, and other conventional means may be used to confirm the various states of the channel units. It is therefore intended that the foregoing detailed description be regarded as illustrative rather than limiting and that it be understood that it is the following claims, including all equivalents, which are intended to define the scope of this invention.

What is claimed is:

1. A method for adjusting the output power of a multi-carrier communication system comprising a plurality of channel units, said method comprising:

measuring the output power of each of said channel units;
   obtaining the current output power of said system;
   calculating a composite power based on said output power of each of said channel units;
   calculating an expected power at the output of said system based on said composite power and a desired gain;
   comparing said expected power with said current output power;
   calculating a gain adjustment value based on said comparison; and
   adjusting said output power of said system based on said gain adjustment value.

2. The method as recited in claim 1 wherein the step of comparing said expected power with said current output power further comprises subtracting said current output power from said expected power to obtain a differential gain value.

3. The method as recited in claim 2 wherein the step of calculating a gain adjustment value further comprises reading the current gain of said system and adding said gain adjustment value to said current gain.

4. The method as recited in claim 1 further comprising the step of confirming that at least one of said channel units is transmitting before said step of measuring the output power of said channel units.

5. The method as recited in claim 4 wherein said step of confirming that at least one of said channel units is transmitting further comprises the steps of:

polling the status of each of said channel units; and
   initiating a transmission if none of said channel units is transmitting.

6. The method as recited in claim 5 further comprising the step of terminating said transmission after said step of calculating said gain adjustment value.

7. The method as recited in claim 1 further comprising the step of confirming that said channel units are operating in a continuous mode.

8. The method as recited in claim 7 wherein the step of confirming that said channel units are operating in a continuous mode further comprises the substep of:

disabling the voice activation mode of said channel units before said step of measuring the output power of said channel units.

9. The method as recited in claim 1 further comprising the step of analyzing said channel units to determine if a transition occurred in any of said channel units during said step of measuring the output power of each of said channel units.

10. The method as recited in claim 9 wherein said substep of polling said channel units is performed by reading transition detectors linked to said channel units.

11. A method for adjusting the gain for an amplifier in a multi-carrier communication system having a plurality of channel units and a commissioned gain value and a current gain value, said method comprising:

selecting one of said channel units to perform power calculations;
    polling said channel units to confirm that at least one of said channel units is operating in a continuous mode;
    measuring the output power of each of said channel units operating in a continuous mode;
    measuring the current output power of said amplifier;
    summing said output powers of each of said channel units operating in a continuous mode with said commissioned gain to obtain an expected output power;
    subtracting said current output power from said expected output power to obtain a new gain adjustment value;
    adding said new gain adjustment value to said current gain value to obtain an amplifier adjustment value; and
    adjusting the gain of said amplifier based on said amplifier adjustment value.

12. The method as recited in claim 11 wherein said method is controlled by one of said plurality of channel units.

13. A multi-carrier communication system comprising:

an interface for converting user voice or data into an intermediate frequency signal;
    a plurality of interconnected channel units for operating on said intermediate frequency signal, at least one of said channel units selectable as a power control channel unit;
    a radio power amplifier designed to operate at fixed-output power; and
    a radio frequency module connected to said channel units, said radio power amplifier, and said interface, said radio frequency module for reading the output power, gain, and expected power of said radio power amplifier; said radio frequency module for collecting data indicative of said intermediate frequency signal.

14. The multi-carrier communication system of claim 13 further comprising a plurality of transition detectors connected to said channel units, said transition detectors for sensing whether any of said channel units has initiated or terminated a call.

15. The multi-carrier communication system of claim 14 wherein said radio frequency module is in communication with said transition detectors.

16. The multi-carrier communication system of claim 13 wherein said channel units perform demodulation, decoding and channel decoding operations on said intermediate frequency signal.

17. A method for adjusting the output power of a multi-carrier communication system comprising a plurality of operating carriers, said method comprising:

operating at least one of said carriers in a burst mode;
    operating at least one of said remaining carriers in a continuous mode;
    measuring the output power of each of said carriers operating in a continuous mode;
    calculating a composite power based on said power of each of said carriers operating in a continuous mode; and
    calculating a gain adjustment value based on said composite power.

18. The method as recited in claim 17 wherein the step of calculating the gain adjustment value based on said composite power further comprises the substeps of:

calculating an expected power at the output of said system based on said composite power and a desired gain;

comparing said expected power with said current output power; and calculating a gain adjustment value based on said comparison.

19. The method as recited in claim 17 wherein the step of calculating a composite power further comprises the substeps of:

measuring the duty cycle times of said carrier operating in a burst mode;

reading the calibrated power of the source of said carrier operating in a burst mode and multiplying said calibrated power by said duty cycle times to obtain a first power value; and summing the power of said carriers operating in a continuous mode with said first power value.

* * * * *